United States Patent
Noguchi et al.

(10) Patent No.: US 6,172,380 B1
(45) Date of Patent: Jan. 9, 2001

(54) SEMICONDUCTOR MATERIAL

(75) Inventors: Takashi Noguchi; Yuji Ikeda, both of Kanagawa (JP)

(73) Assignee: Sony Corporation, Tokyo (JP)

( * ) Notice: Under 35 U.S.C. 154(b), the term of this patent shall be extended for 0 days.

(21) Appl. No.: 09/187,224

(22) Filed: Nov. 6, 1998

(30) Foreign Application Priority Data

Nov. 7, 1997 (JP) .................................................. 9-305552

(51) Int. Cl.$^7$ .......................... H01L 29/04; H01L 31/036
(52) U.S. Cl. .................................. 257/64; 65/66; 65/70; 65/75; 65/77; 65/627; 65/628; 438/149; 438/150; 438/535
(58) Field of Search ................................. 257/64, 66, 70, 257/75, 627, 628, 65, 77; 438/150, 149, 535

(56) References Cited

U.S. PATENT DOCUMENTS

| 5,608,232 | * | 3/1997 | Yamazaki et al. | 257/66 |
| 5,619,044 | * | 4/1997 | Makita et al. | 257/64 |
| 5,670,793 | * | 9/1997 | Miura et al. | 257/64 |
| 5,808,321 | * | 9/1998 | Mitanaga et al. | 257/72 |
| 5,895,933 | * | 4/1999 | Zhang et al. | 257/49 |
| 5,949,091 | * | 9/1999 | Yamaguchi | 257/64 |
| 5,959,313 | * | 9/1999 | Yamazaki et al. | 257/59 |
| 5,959,314 | * | 9/1999 | Voutsas | 257/65 |
| 5,962,871 | * | 10/1999 | Zhang et al. | 257/66 |
| 6,037,610 | * | 3/2000 | Zhang et al. | 257/64 |

FOREIGN PATENT DOCUMENTS 10-041234    2/1998    (JP) .
10-261799    9/1998    (JP) .

OTHER PUBLICATIONS

Ikeda et al., "Crystallization Mechanism of Compulsive Localized Nucleation by ELA," *Proceedings of the 44$^{th}$ Symposium on Semiconductors and Integrated Circuits Technology*, Tokyo, Jun. 17–18, 1993, pp. 187–192.

Kim et al., "Hexagonal silicon formation by pulsed laser beam annealing," *Materials Letters*, v. 27, Aug. 1996, pp. 275–279.

* cited by examiner

Primary Examiner—William Mintel
(74) Attorney, Agent, or Firm—Ronald P. Kananen; Rader, Fishman & Grauer

(57) ABSTRACT

A semiconductor material having more excellent electric characteristics than polycrystalline semiconductor materials and readily formed on various kinds of substrates is provided. The semiconductor material is made of substantially single crystalline semiconductor crystal grains 3a. These crystal grains 3a are preferentially oriented in a common surface orientation, such as {100}, {111} or {110}-orientation, and grain boundaries 3b of adjacent ones of the crystal grains 3a are in substantial lattice matching with each other at least in a part thereof. In case of {100} orientation, each crystal grain 3a has an approximately square shape, and they are regularly aligned in rows and columns. In case of {111} orientation, each crystal grain 3a has an approximately equilateral hexagonal shape, and they are aligned in an equilateral turtle shell pattern. In case of {110} orientation, each crystal grain 3a has an approximately hexagonal shape, and they are aligned in a turtle shell pattern. The semiconductor forming the crystal grains 3a is a group IV semiconductor having a diamond-type crystal structure, such as Si, Ge and C.

9 Claims, 8 Drawing Sheets

SEMICONDUCTOR MATERIAL

BACKGROUND OF THE INVENTION

1. Field of the Invention

This invention relates to a semiconductor material especially suitable for use in forming a semiconductor layer on an insulator, for example, to make a device using the semiconductor layer.

2. Description of the Related Art

In the field of MOSLSI, technologies on SOI (silicon on insulator) are now being actively developed to meet the requirement of the use for lower source voltages. Heretofore, various methods for fabricating SOI substrates have been proposed, and some have been brought into practice. Today's typical methods for fabricating SOI substrates include a SIMOX process and a bonding process, but all involve the problems that it is difficult to control the thickness of the silicon (Si) film uniformly under 60 nm and the cost for fabricating the substrate is high, and these problems impede their wider practical use.

On the other hand, it is possible to make Si crystalline thin films on various kinds of substrates such as glass substrates by using the bonding process, but it becomes more and more difficult to ensure a uniform thickness of a film as the area for making the film becomes larger.

Moreover, although polycrystalline Si films can be readily formed on glass substrates or other various kinds of substrates, their electric characteristics are not satisfactory because of variance in grain size of crystal grains, existence of grain boundaries, randomness in orientation of crystal grains, and so forth.

OBJECTS AND SUMMARY OF THE INVENTION

It is therefore an object of the invention to overcome the problems involved in the conventional technologies. That is, an object of the invention is to provide a semiconductor material that excels in its electrical characteristics relative to polycrystalline semiconductor materials and can be easily formed on various kinds of substrates.

According to the invention, there is provided a semiconductor material comprising a plurality of substantially single-crystalline crystal grains of a semiconductor, these crystal grains being preferentially oriented in a common surface orientation, and adjacent ones of the crystal grains being substantially in lattice matching with each other at least in a part of grain boundaries thereof.

Since the crystallographic property of the semiconductor material according to the invention is similar to that of a single crystal, it is called "quasi-static single crystal" in the present specification.

In the present invention, typical semiconductors forming crystal grains are covalent bonding type semiconductors having diamond-type crystalline structures. In this case, a plurality of crystal grains are preferentially {100}-oriented, {111}-oriented or {110}-oriented. When the crystal grains are preferentially {100}-oriented, individual crystal grains are approximately square when viewed from a direction, and they are closely aligned in rows and columns. When the crystal grains are preferentially {111}-oriented, individual crystal grains are approximately hexagonal when viewed from a direction, and they are closely aligned to form an equilateral turtle shell pattern. When the crystal grains are preferentially {110}-oriented, individual grains are approximately hexagonal when viewed from a direction, and they are closely aligned to form a turtle shell pattern.

In the present invention, the degree of orientation of crystal grains in the preferential orientation is preferably not less than 20%, and more preferably not less than 30%. However, crystal grains in the preferential orientation involve those in orientations offset within ±5° from one orientation.

In the present invention, the mean grain size of crystal grains is not smaller than 0.1 $\mu$m and not larger than 10 $\mu$m. The crystal grains are preferably equal in grain size.

In the present invention, typical covalent bonding type semiconductors having diamond-type crystal structures are group IV semiconductors, namely, element semiconductors such as silicon (Si), germanium (Ge) and carbon (C), and compound semiconductors containing Si and at least one selected from the group consisting of Si, Ge and C, such as SiGe and SiC.

In the present invention, the semiconductor material is typically made in the form of a thin film on a substrate. The thickness of the quasi-static single crystalline semiconductor thin film made in this manner is 10 nm to 100 nm, for example, although it depends on where and how it is used.

The semiconductor material having the above-explained structure according to the invention is excellent in electric characteristics as compared with conventional polycrystalline semiconductor materials because crystal grains are substantially single crystals and preferentially oriented in a common orientation, and because adjacent crystal grains are substantially lattice-matching at least in a part of their grain boundaries where, therefore, the electric barrier is less. Additionally, the semiconductor material can be readily made on a glass substrate or any of other various kinds of substrates by combining deposition process such as a CVD, laser annealing using an excimer laser, solid-phase crystallization, or other appropriate technologies.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Explained below are embodiments of the invention with reference to the drawings. In all drawings illustrating the embodiments, the same or equivalent elements or parts are labeled with common reference numerals.

Figure 1:
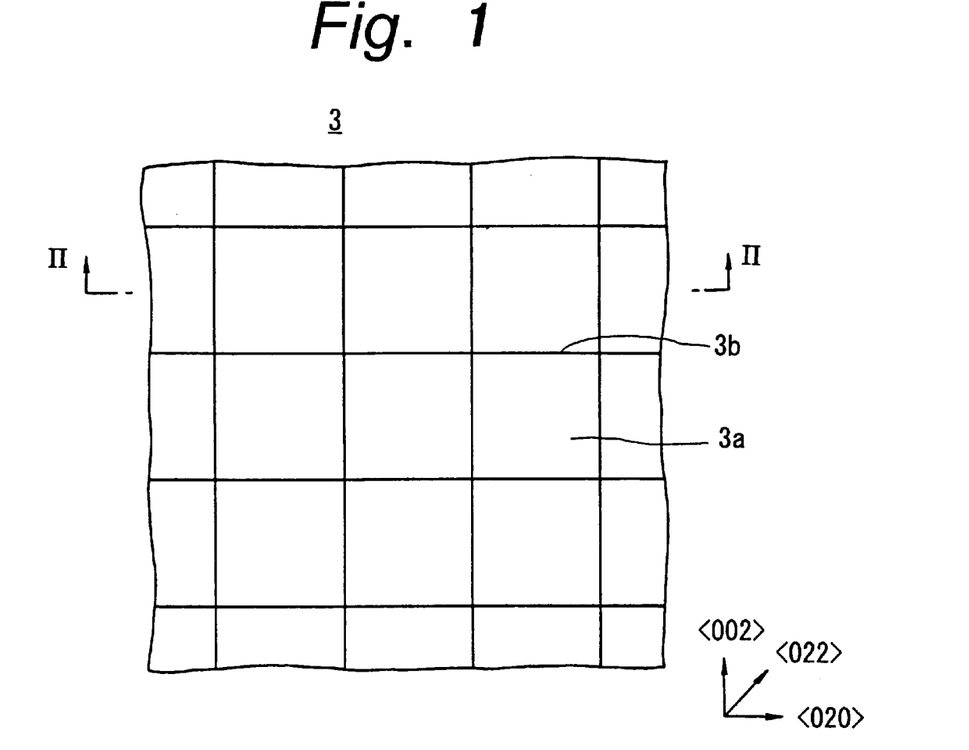
FIG. 1 is a plan view showing a SOI structure according to the first embodiment of the invention.
Figure 2:
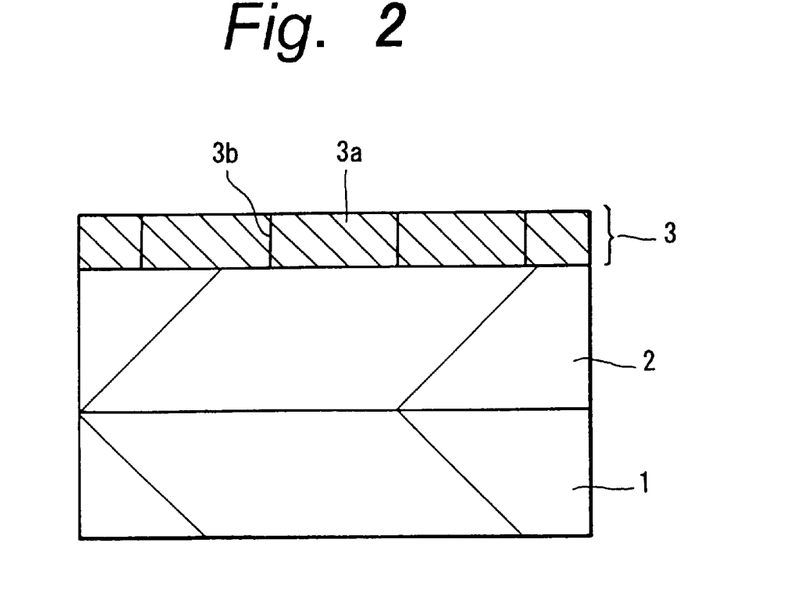
FIG. 2 is a cross-sectional view taken along the II—II line of FIG. 1.

FIGS. 1 and 2 show an SOI structure according to the first embodiment of the invention, in which FIG. 1 is a plan view, and FIG. 2 is a cross-sectional view taken along the II—II line of FIG. 1.

As shown in FIGS. 1 and 2, in the SOI structure according to the first embodiment, a quasi-static single crystalline Si film is formed on an $SiO_2$ film 2 made on a Si substrate 1. The quasi-static single crystalline Si film 3 is made of substantially single-crystalline crystal grains 3a which are preferentially {100}-oriented, square-shaped, and closely aligned in rows and columns. Four side surfaces of each crystal grain 3a are {002}-oriented surfaces. Adjacent ones of the crystal grains 3a are in lattice-matching with each other at least in a part of their grain boundaries 3b. The thickness of the quasi-static single crystalline Si film 3 is, for example, 100 nm, and the mean grain size of the crystal grains 3a is, for example, is 0.1 to 10 μm.

Next explained is a method for fabricating the SOI structure having the above-explained structure according to the first embodiment.

Figure 3:
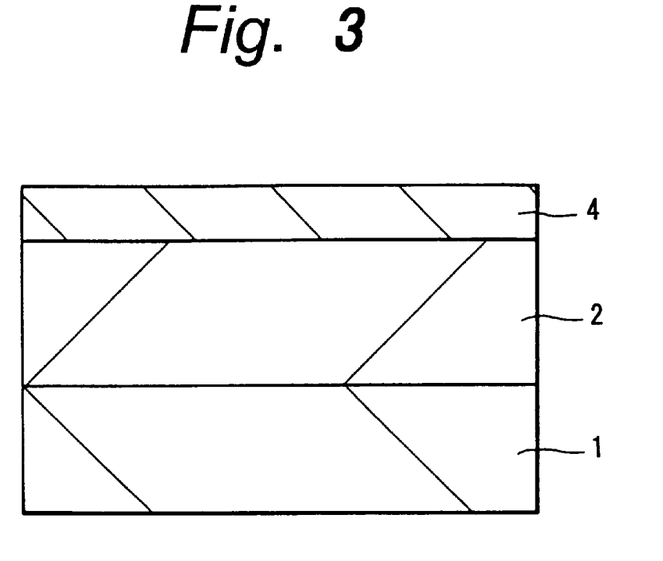
FIG. 3 is a cross-sectional view for explaining a method for fabricating the SOI structure according to the first embodiment of the invention.

As shown in FIG. 3, after the $SiO_2$ film 2 is first made on the Si substrate 1 by CVD, for example, a Si film 4 is made on the $SiO_2$ film 2 by low-pressure CVD, for example.

Figure 4:
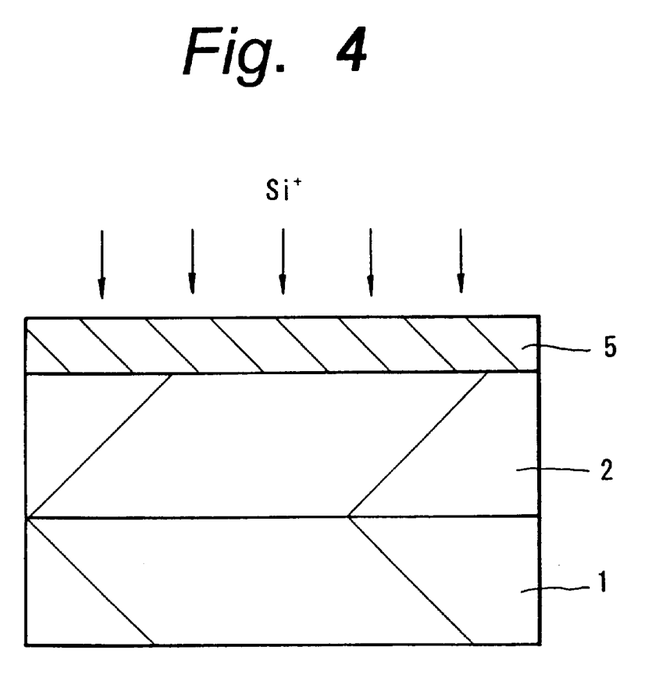
FIG. 4 is a cross-sectional view for explaining a method for fabricating the SOI structure according to the first embodiment of the invention.

Next, as shown in FIG. 4, Si ions, for example, are implanted into the Si film 4 to change it into an amorphous Si film 5. Si ions are implanted under the condition: the energy being 25 keV and the dose being $1.5 \times 10^{15}$ $cm^{-2}$, for example.

Figure 5:
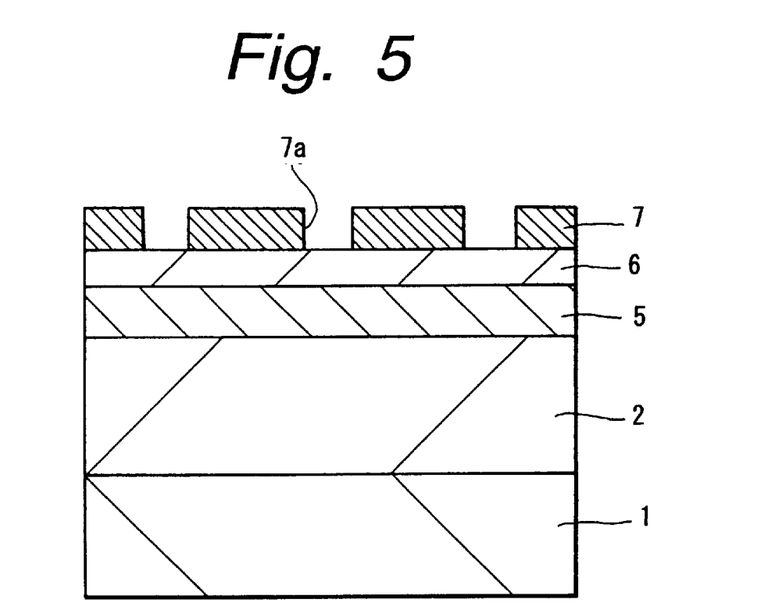
FIG. 5 is a cross-sectional view for explaining a method for fabricating the SOI structure according to the first embodiment of the invention.

Next, as shown in FIG. 5, a $SiO_2$ film 6 is formed on the amorphous Si film 5 by CVD, for example. The $SiO_2$ film 6 is used as an anti-reflection film during irradiation of pulse laser beams explained later. The thickness of the $SiO_2$ film 6 is 50 nm, for example. Next formed on the $SiO_2$ film 6 is a Si film 7 by low-pressure CVD, for example. After that, formed on the Si film 7 by lithography is a resist pattern (not shown) having circular openings in alignment with centers of crystal grains 3a shown in FIGS. 1 and 2. Using the resist pattern as a mask, the Si film 7 is selectively removed by etching to form circular openings 7a. The thickness of the Si film 7 is 100 nm, for example, and the diameter of each opening 7a is 0.8 μm, for example.

Figure 6:
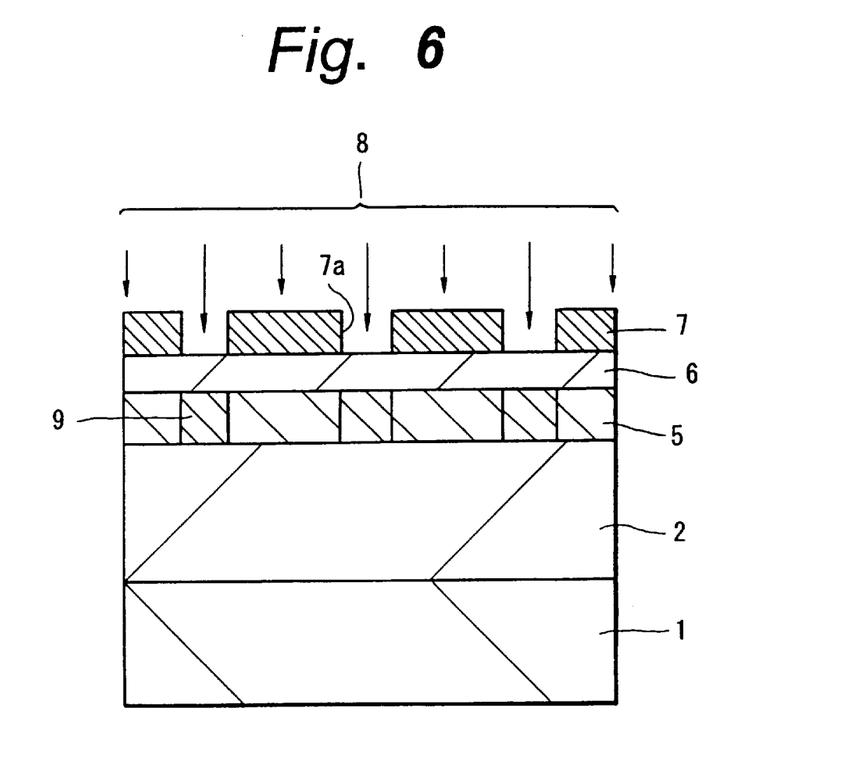
FIG. 6 is a cross-sectional view for explaining a method for fabricating the SOI structure according to the first embodiment of the invention.

Next, as shown in FIG. 6, pulse laser beams 8 of an ultraviolet wavelength are irradiated from the side of the Si film 7 by using an excimer laser, for example. The shape of the spot on the surface for irradiation of the pulse laser beams 8 is a rectangle, for example, having a width (W) not shorter than 40 μm and not longer than approximately 1 mm, for example, 400 μm, and any arbitrary length such as 150 mm, for example. Irradiation of the pulse laser beams 8 may be practically conducted as follows. By fixing the irradiating direction of the pulse laser beams 8 while moving the Si substrate 1 relative to the pulse laser beams 8 in the width direction of the spot, irradiation of the pulse laser beams 8 is repeated. In this case, the moving direction may be parallel to a side of the crystal grains 3a shown in FIGS. 1 and 2. The movement is controlled here so that the moving distance L of the Si substrate 1 is not longer than 40 μm, preferably not longer than 4 μm (for example, 4 μm) between two continuous cycles of irradiation, and the ratio L/W of the moving distance L relative to the spot width W of the pulse laser beams 8 is 0.1 to 5%, preferably 0.5 to 2.5% (for example, 1%). L/W being 0.1 to 5% means that the pulse laser beams 8 overlap by 99.9 to 95% between continuous two cycles of irradiation, while L/W being 0.5 to 2.5% means that the pulse laser beams 8 overlap by 99.5 to 97.5% between two continuous cycles of irradiation. The pulse laser beams 8 may be those having the wavelength of 308 nm released from a XeCl excimer laser. The irradiation energy density of the pulse laser beams 8 may be 320 $mJ/cm^2$, the pulse width may be approximately 26 ns, and the frequency may be approximately 200 Hz.

In this case, the pulse laser beams 8 irradiated onto the Si film 7 are absorbed by the Si film 7. That is, the Si film 7 behaves as a mask for the pulse laser beams 8. As a result, only a part of the pulse laser beams 8 passing through the openings 7a is irradiated onto the amorphous Si film 5 and heats these portions of the amorphous Si film 5 to a high temperature. Therefore, portions of the amorphous Si film 5 under the openings 7a are melted and recrystallized. Numeral 9 denotes recrystallized regions made in this manner.

Figure 7:
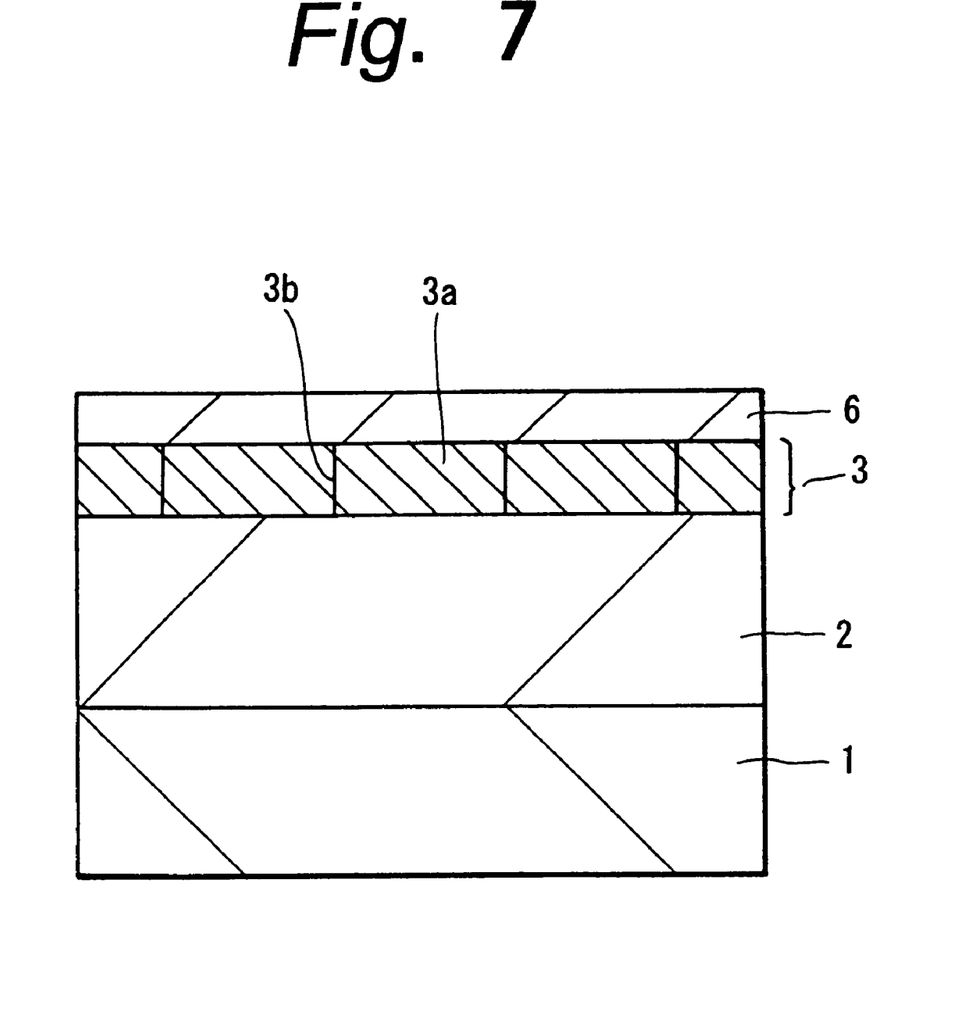
FIG. 7 is a cross-sectional view for explaining a method for fabricating the SOI structure according to the first embodiment of the invention.

The Si film 7 is next removed by etching. Thereafter, the semi-product is annealed at 600° C. for 5 to 20 hours, for example, in an annealing furnace, for example, to change the amorphous Si film 5 into a solid-phase crystal using the recrystallized regions 9 as the seed crystal. As a result, as shown in FIG. 7, substantially single-crystalline square crystal grains 3a grow about the portions where the recrystallized regions 9 were present, and the quasi-static single crystalline Si film 3 is obtained.

After that, the $SiO_2$ film 6 is removed by etching. As a result, the intended SOI structure as shown in FIGS. 1 and 2 is completed.

On technologies of laser annealing by irradiation of pulse laser beams and subsequent treatment for solid-phase crystallization, "Proceedings of the 44th symposium on semiconductors and integrated circuits technology, p.187 (1993)" and "Materials Letters 27(1996) 275–279" present related descriptions. Further, Japanese Patent Application No. Hei 9-64036 and Japanese Patent Application No. Hei 9-88728 propose technologies for promising regular alignment of {100}-oriented square single-crystalline crystal grains in rows and columns, which was impossible before.

Figure 8:
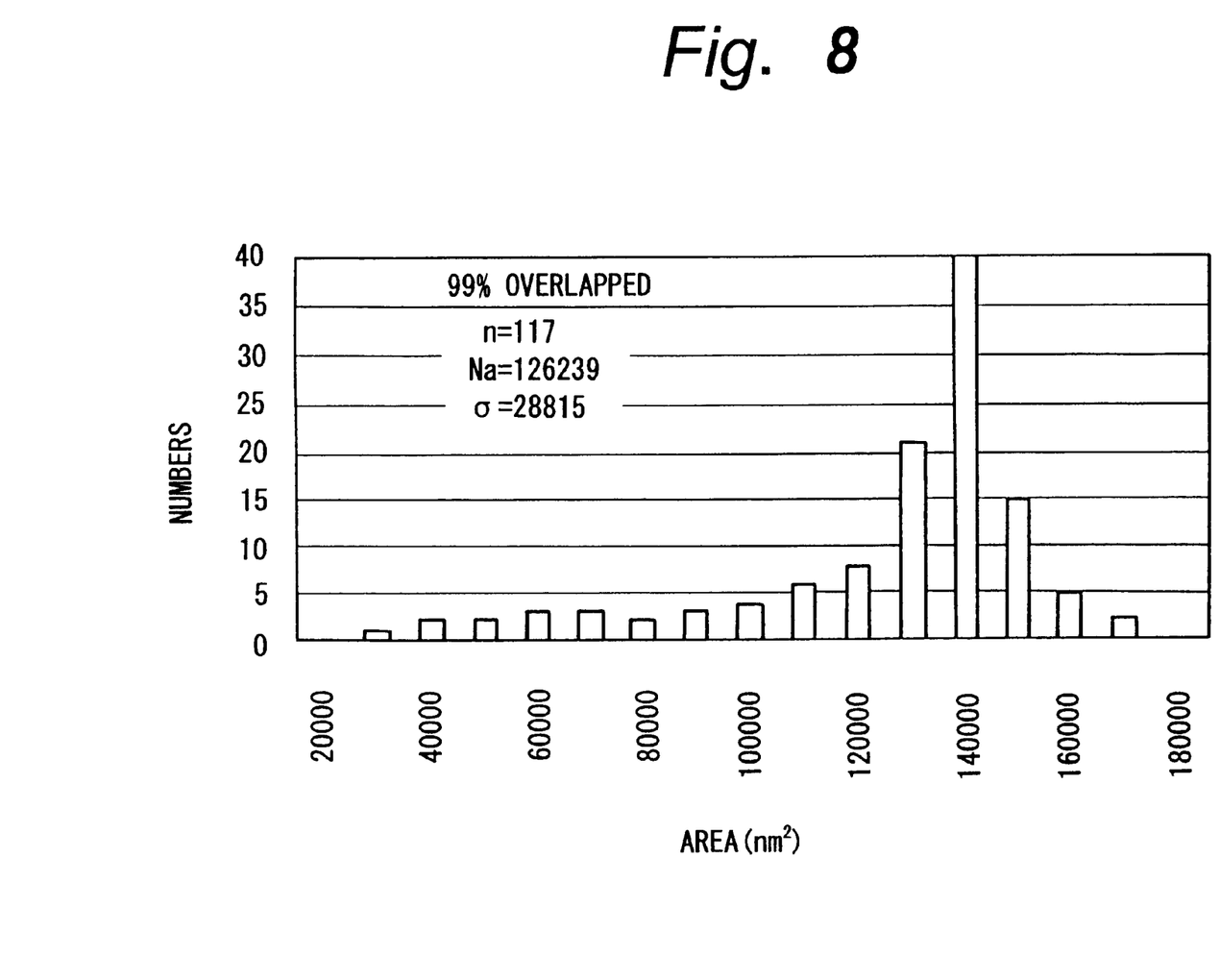
FIG. 8 is a schematic view showing a result of measurement of grain size distribution of crystal grains in a quasi-static single crystalline Si film having a SOI structure made by the method according to the first embodiment of the invention.
Figure 9:
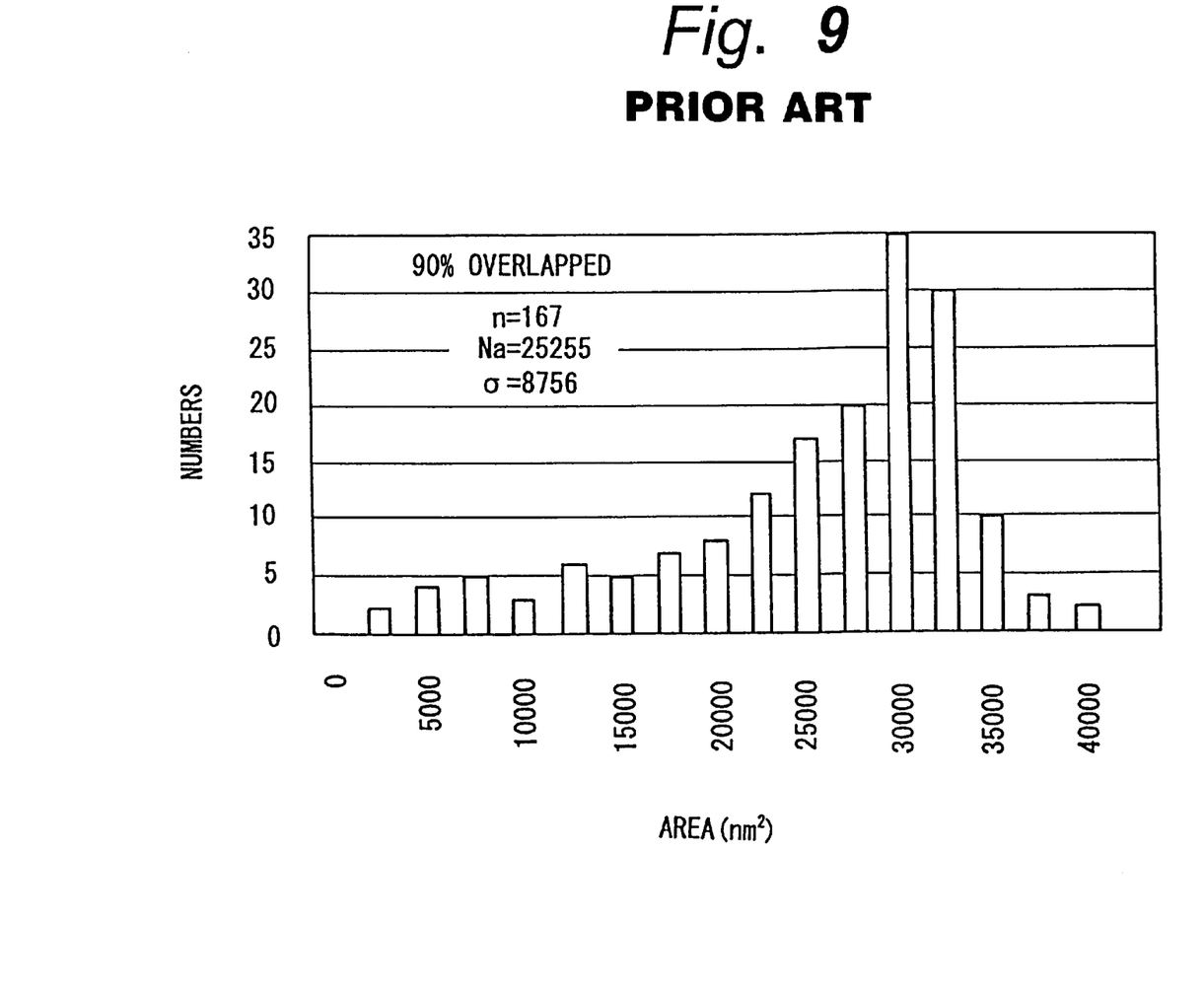
FIG. 9 is a schematic diagram showing a result of measurement of grain size distribution of crystal grains in a conventional polycrystalline Si film.

FIG. 8 shows a result of investigation of grain size distribution (in terms of grain area distribution) of crystal grains 3a in the quasi-static single crystalline Si film 3 in the SOI structure prepared by the method according to the first embodiment where the pulse laser beams 8 were irradiated to overlap by 99% between continuous two cycles of irradiation. For comparison purposes, FIG. 9 shows a result of investigation of grain size distribution (in terms of grain area distribution) of crystal grains in a conventional polycrystalline Si film made by low-pressure CVD where pulse laser beams 8 were irradiated to overlap by 90% between continuous two cycles of irradiation. In FIGS. 8 and 9, n is the total number of crystal grains, $N_a$ is the mean area of crystal grains, and σ is the standard deviation. When the mean grain size of crystal grains is <L> and the area of a crystal grain is S, $<L> \sim S^{1/2}$.

It is apparent from comparison between FIG. 8 and FIG. 9, the grain size of crystal grains in the quasi-static single crystalline Si film 3 in the SOI structure made by the method according to the first embodiment is significantly larger and more even than crystal grains in the conventional polycrystalline Si film.

As explained above, according to the first embodiment, the quasi-static single crystalline Si film 3 formed on the $SiO_2$ film 2 is more excellent in electric characteristics than the conventional polycrystalline Si film because it is made up of substantially single-crystalline crystal grains 3a preferentially {100}-oriented, adjacent ones of crystal grains 3a are in lattice matching at least in a part of their grain boundaries 3b, and the grain size of the crystal grain 3a is larger and more uniform than that of the conventional polycrystalline Si film. Therefore, a good-quality SOI structure equivalent to bulk single-crystalline Si can be realized. Using this SOI structure to make a thin-film transistor (TFT), for example, high-performance TFT equivalent to MOSFET using bulk single-crystalline Si can be realized.

Figure 10:
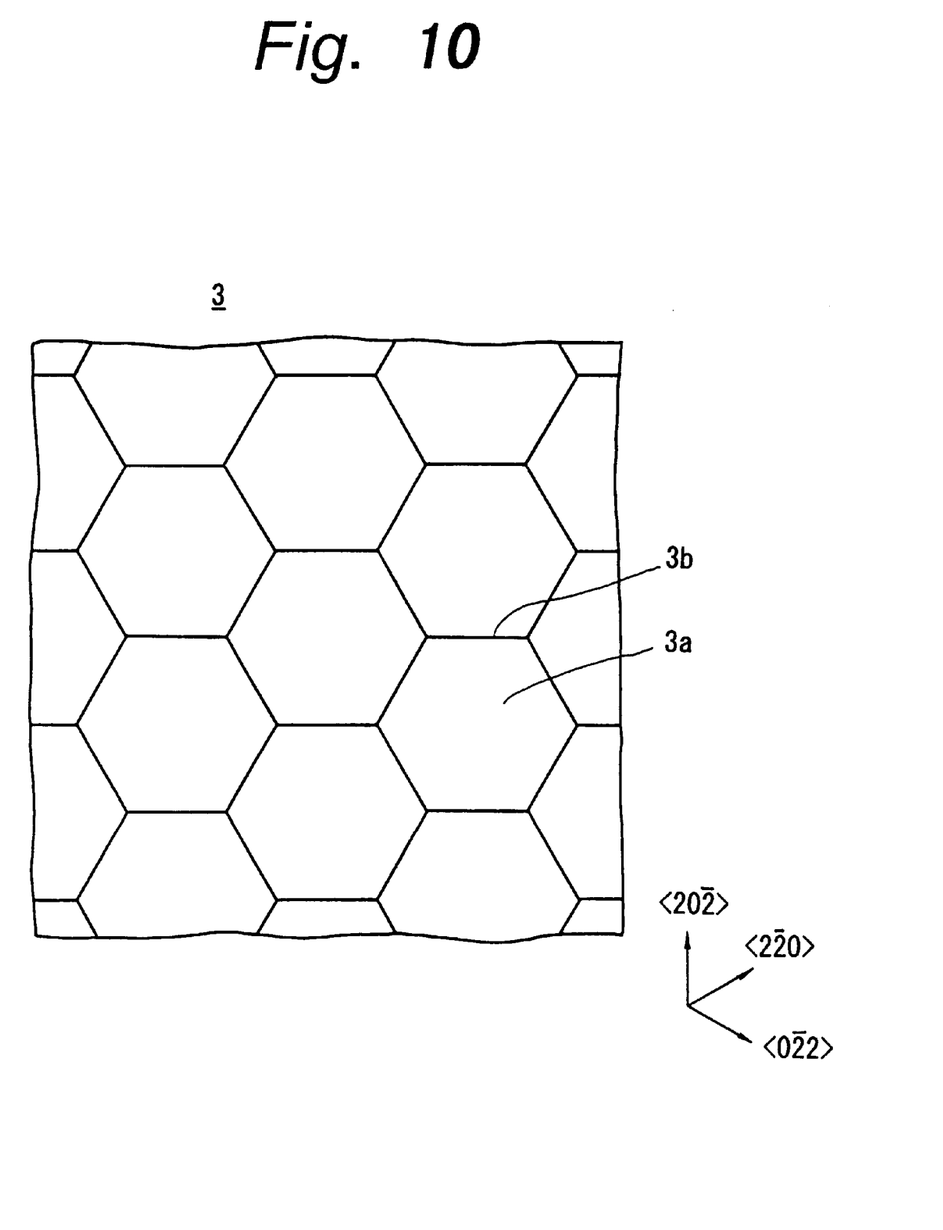
FIG. 10 is a plan view of a SOI structure according to the second embodiment of the invention.

FIG. 10 shows an SOI structure according to the second embodiment of the invention. As shown in FIG. 10, in the SOI structure according to the second embodiment, the quasi-static single crystalline Si film 3 is made of equilateral hexagonal substantially single-crystalline crystal grains 3a which are preferentially {111}-oriented and two-dimensionally aligned in an equilateral turtle shell pattern. Six side surfaces of each crystal grain 3a are {202}-oriented. In the other respects, the SOI structure shown here is the same as the SOI structure according to the first embodiment.

The SOI structure according to the second embodiment can be made by the same process as explained with the SOI structure according to the first embodiment.

Also the second embodiment promises the same advantages as those of the first embodiment.

Figure 11:
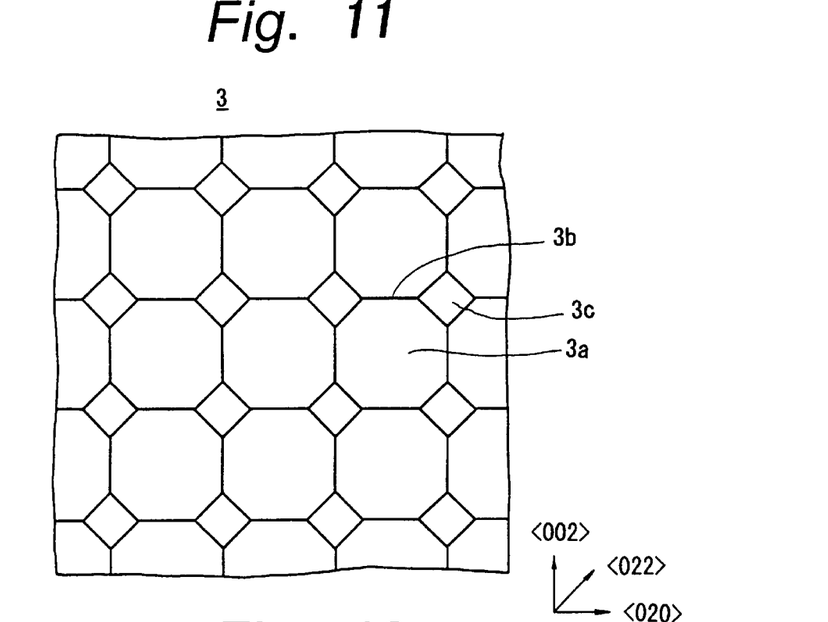
FIG. 11 is a plan view showing a SOI structure according to the third embodiment of the invention.

FIG. 11 shows a SOI structure according to the third embodiment of the invention. As shown in FIG. 11, in the SOI structure according to the third embodiment, the quasi-static single crystalline Si film 3 is made of substantially single-crystalline crystal grains 3a which are preferentially {100}-oriented and aligned two-dimensionally. In this case, each crystal grain 3a has a shape made by cutting four corners of a square, namely, an octagon. In each portion surrounded by four crystal grains 3a, a single-crystalline crystal grain 3c smaller than the crystal grain 3a exists. Four side surfaces other than four corners of each crystal grain 3a are {002}-oriented whereas side surfaces at four corners are {022}-oriented. Moreover, adjacent ones of these crystal grains 3a and 3c are in lattice matching with each other at least in a part of their grain boundaries 3b. In the other respects, the SOI structure shown here is the same as the SOI structure according to the first embodiment.

Also the SOI structure according to the third embodiment can be made by the process explained with the SOI structure according to the first embodiment.

Also the third embodiment promises the same advantages as those of the first embodiment.

Figure 12:
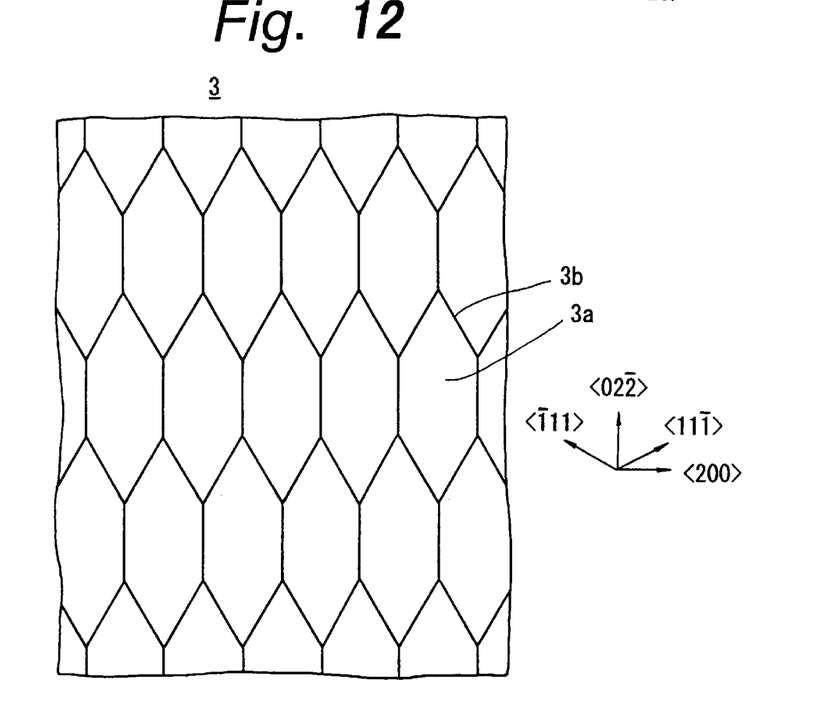
FIG. 12 is a plan view showing a SOI structure according to the fourth embodiment of the invention.

FIG. 12 shows a SOI structure according to the fourth embodiment of the invention. As shown in FIG. 12, in the SOI structure according to the fourth embodiment, the quasi-static single crystalline Si film 3 is made of hexagonal substantially single-crystalline crystal grains 3a which are preferentially {110}-oriented and two-dimensionally aligned in a turtle shell pattern. Six side surfaces of each crystal grain 3a are {200}- and {111}-oriented. In the other respects, the SOI structure shown here is the same as the SOI structure according to the first embodiment.

Here again, the SOI structure can be made by the process explained with the SOI structure according to the first embodiment.

Also the fourth embodiment promises the same advantages as those of the first embodiment.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, materials, structures and processes indicated in the explanation of the first to third embodiments are only examples, and other appropriate numerical values, materials, structures and processes may be employed.

Similarly, although the first to fourth embodiments use pulse laser beams by an XeCl excimer laser as the pulse laser beams 8, they may be pulse laser beams from any appropriate excimer laser other than the XeCl excimer laser, or from a laser other than excimer lasers, such as a fully solid ultraviolet laser.

As described above, the semiconductor material according to the invention is made of substantially single-crystalline crystal grains of a semiconductor which are preferentially oriented in one direction and adjacent ones of which are in lattice matching with each other at least in a part of their grain boundaries. Therefore, the semiconductor material is more excellent in electric characteristics than polycrystalline semiconductor materials, and can be readily formed on various kinds of substrates.

What is claimed is:

1. A semiconductor material comprising a plurality of substantially single-crystalline crystal grains of a semiconductor, said crystal grains being preferentially oriented in a common surface orientation, and adjacent ones of said crystal grains being substantially in lattice matching with each other at least in a part of grain boundaries thereof, wherein the degree of orientation of said crystal grains is not less than 20%.

2. The semiconductor material according to claim 1 wherein said semiconductor is a covalent bonding type semiconductor having a diamond-type crystal structure.

3. The semiconductor material according to claim 2 wherein said crystal grains are preferentially {100}-oriented.

4. The semiconductor material according to claim 3 wherein said crystal grains are substantially square individually when viewed from a direction and are regularly aligned in rows and columns.

5. The semiconductor material according to claim 2 wherein said crystal grains are {111}-oriented preferentially.

6. The semiconductor material according to claim 5 wherein said crystal grains are substantially hexagonal individually when viewed from a direction and are aligned in a equilateral shell turtle pattern.

7. The semiconductor material according to claim 2 wherein said crystal grains are {110}-oriented preferentially.

8. The semiconductor material according to claim 7 wherein said crystal grains are substantially hexagonal individually when viewed from a direction and are aligned in a turtle shell pattern.

9. The semiconductor material according to claim 1 wherein the degree of orientation of said crystal grains is not less than 30%.

* * * * *